United States Patent
Chang et al.

[11] Patent Number: 5,834,351
[45] Date of Patent: Nov. 10, 1998

[54] NITRIDATION PROCESS WITH PERIPHERAL REGION PROTECTION

[75] Inventors: Yun Chang; Fuchia Shone, both of Hsinchu; Chih Mu Huang, Chang-Hua; Kuo Tung Sung, Taipei, all of Taiwan

[73] Assignee: Macronix International, Co. Ltd., Hsinchu, Taiwan

[21] Appl. No.: 519,106

[22] Filed: Aug. 25, 1995

[51] Int. Cl.$^6$ .............................................. H01L 21/8247
[52] U.S. Cl. .......................................... 438/266; 438/769
[58] Field of Search ................................. 437/43, 48, 241; 148/DIG. 114, DIG. 112, DIG. 117; 438/258, 266, 267, 769, 786

[56] References Cited

U.S. PATENT DOCUMENTS

| | | | |
|---|---|---|---|
| 5,158,902 | 10/1992 | Hanada | 437/43 |
| 5,254,489 | 10/1993 | Nakata | 437/DIG. 112 |

OTHER PUBLICATIONS

Ghandhi, "VLSI Fabrication Principles," Silicon and Gallium Arsenide pp. 495–496, 1983.

J. Kim, A.B. Joshi, G.W. Yoon and D.L. Kwong, "Effects of Residual Surface Nitrogen on the Dielectric Breakdown Characteristics of Regrown Oxides", Proc. of Symp. on VLSI-TSA, p. 100, 1993.

A. Battacharyya, C. Vorst and A.H. Carim, "A Two–Step Oxidation Process to Improve the Electrical Breakdown Properties of Thin Oxides", J. Eletrochem. Soc., vol. 132, No. 8, p. 1900, 1985.

J.C. Chen, S. Holland and C. Hu, "Electrical Breakdown in Thin Gate and Tunnelling Oxides", IEEE Trans. Electron Devices, vol. ED–32, p. 413, 1985.

*Primary Examiner*—Chandra Chaudhari
*Attorney, Agent, or Firm*—Wilson Sonsini Goodrich & Rosati

[57] ABSTRACT

A process is provided for fabricating an integrated circuit in which an oxynitride layer is selectively formed in a first active region without forming an oxynitride layer in a second active region peripheral to the first active region. In one embodiment, the memory cell is fabricated where an oxynitride layer is prevented from forming in a region peripheral to the memory array region. In an alternate embodiment, the memory cell is fabricated where an oxynitride layer formed in a region peripheral to the memory array region is selectively removed.

11 Claims, 7 Drawing Sheets

ARRAY PERIPHERAL

ARRAY                    PERIPHERAL
FIGURE 2B
⇩
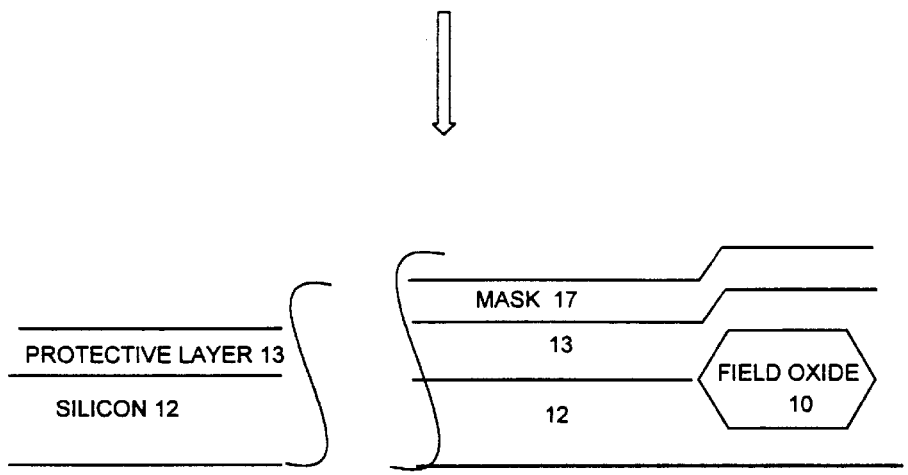
FIGURE 2H
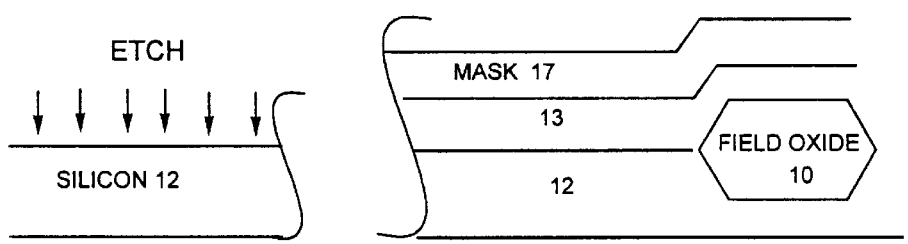
FIGURE 2I
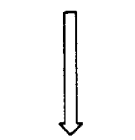
FIGURE 2C

ARRAY PERIPHERAL

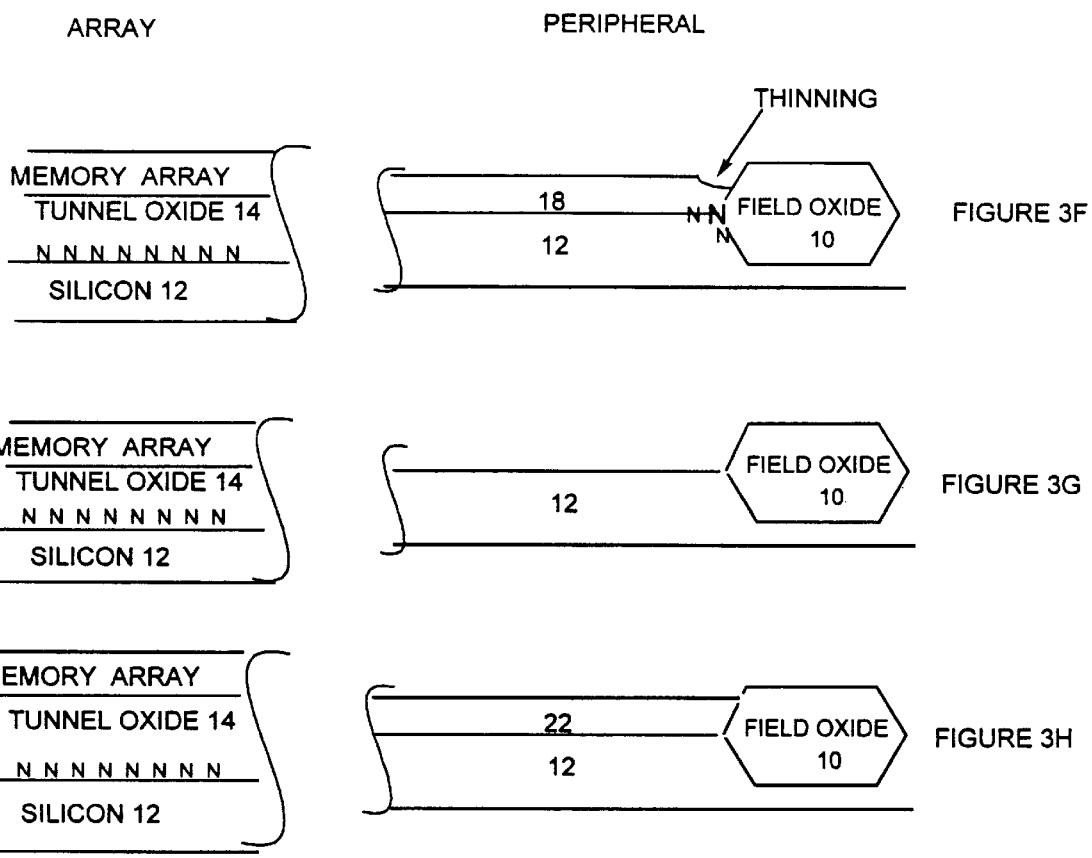

NITRIDATION PROCESS WITH PERIPHERAL REGION PROTECTION

BACKGROUND OF THE INVENTION

1. Field of the Invention

The invention relates to a process for fabricating integrated circuits, such as non-volatile memory devices like EPROM, EEPROM and flash EPROM devices. More specifically, the invention relates to a process for fabricating integrated circuits in which an oxynitride layer is selectively formed in selected regions of the integrated circuit, such as in a memory array, but not in other regions.

2. Description of Related Art

Nonvolatile memory devices, such as EPROM, EEPROM and flash EPROM devices, generally include a series of transistors which act as memory cells. Each transistor includes source and drain regions formed on a n- or p- type semiconductor substrate, a thin tunnel dielectric layer formed on the surface of the semiconductor substrate positioned between the source and drain regions, a floating gate positioned on the insulating layer for holding a charge, a control gate and an interpoly dielectric positioned between the floating gate and the control gate. Transistors on the array are separated from other transistors by a field oxide. The field oxide is generally grown to be quite thick and is commonly several thousand angstroms thick.

Reducing the thickness of the tunnel dielectric is of primary importance to the development of high density nonvolatile memory devices. With all methods for transferring a charge to a floating gate, the amount of energy needed to introduce a charge into the floating gate depends on the capacitance between the floating gate and the control gate which, in turn, depends on the thickness of the tunnel dielectric layer. In order to minimize the amount of energy needed to transfer a charge into and out of the floating gate, as well as to minimize the amount of heat generated by the device during programming, it is desirable to minimize the thickness of the tunnel dielectric layer.

Formation of an oxynitride layer at the silicon-oxide interface during fabrication of the memory cells has been identified as being desirable for enhancing the physical and electrical properties of the tunnel dielectric. In addition, the oxynitride layer limits the oxidation of silicon and thus enables a silicon dioxide layer of a limited thickness to be grown. The improved physical properties and self-limiting growth of the tunnel dielectric achieved due to the presence of an oxynitride layer enables thinner tunnel dielectric layers to be formed and used.

Formation of the oxynitride layer during fabrication of the memory cells, however, has the disadvantage that nitrogen can be embedded in oxides, such as in field oxides, in areas peripheral to the regions of the device where memory cells are being formed. In these peripheral regions, the residual nitrogen limits the growth of silicon dioxide in subsequent oxide growth processes. For example, the presence of residual nitrogen can cause thinning of peripheral gate oxide formation adjacent field oxides. Thinning of peripheral gate oxides adjacent the field oxide can cause earlier breakdown in the peripheral circuits which are undesirable.

A need therefore exists for a process for fabricating memory cells in which an oxynitride layer is selectively formed in memory array regions without forming residual oxynitride layers in regions peripheral to the memory array.

SUMMARY OF THE INVENTION

Formation of an oxynitride layer at the silicon-oxide interface in integrated circuits has been identified as providing numerous advantages due to the action of the oxynitride layer to self-limit growth of the oxide layer on the oxynitride layer as well as providing enhanced electrical properties to the tunnel dielectric. However, in order to most effectively utilize the oxynitride layer, it is important that processes exist for confining the oxynitride layer to desired regions of the integrated circuit.

This invention relates to a process for fabricating an integrated circuit in which an oxynitride layer is selectively formed in a memory array region without leaving residual oxynitride layers in regions peripheral to the memory array region. In one approach to the process, an oxynitride layer is selectively formed in a memory array region such that little or no oxynitride is formed in peripheral regions. In an alternate approach, any oxynitride layers formed in peripheral regions are selectively removed. The invention also relates to a process for fabricating an integrated circuit in which a gate oxide is formed by high temperature oxidation, a process for oxide growth which is not limited by the presence of nitrogen in neighboring oxide layers.

According to one embodiment of the process of the present invention, an integrated circuit is fabricated by defining at least two active regions on a substrate. The first active region may be, for example, a region peripheral to a memory array region, the memory array region being the second active region defined. According to the process, a protective layer is formed over the first active region and an oxynitride layer is formed over the second active region, the protective layer preventing formation of an oxynitride layer over the first active region. A memory cell is then formed in the second active region, afterwhich the protective layer is removed from the first active region.

The protective layer preferably includes a layer of silicon nitride which preferably has a thickness of at least 100 Å, the minimum thickness depending on the oxynitride layer forming process being employed. The memory cell formed is preferably either an EPROM, EEPROM or a flash EPROM memory cell.

According to an alternate embodiment of the process of the present invention, an integrated circuit is fabricated by defining first and second active regions on a substrate, forming an oxynitride layer on the first and second active regions, forming a memory cell in the second active region, and removing the oxynitride layer from the first active region by treatment of the oxynitride layer with a compound acting as a source of fluoride ions. The fluoride ion source may be a HF based solution, such as a Buffer Oxide Etchant, for providing a wet etch or may be a plasma containing fluoride ions for providing a dry etch. The plasma may be formed using a variety of gases which act as a source of fluoride ions, including, for example, $C_2F_6$, $CF_4$, and $CHF_3$.

According to an alternate embodiment of the process, an integrated circuit is fabricated by defining first and second active regions on a substrate, forming a first oxide layer in the first active region, forming an oxynitride layer in the first and second active regions, forming a memory cell in the second active region, removing the first oxide layer from the first active region, and forming a second oxide layer in the first active region by a high temperature oxidation process.

Other aspects and advantages of the present invention can be seen upon review of the figures, the detailed description, and the claims which follow.

BRIEF DESCRIPTION OF THE FIGURES

FIG. 1A illustrates a field oxide being formed on a silicon substrate to define two active regions, referred to as a memory array region and a peripheral region.

FIG. 1B illustrates a tunnel oxide being grown over the silicon substrate.

FIG. 1C illustrates a nitridation process being performed to form an oxynitride layer during which nitrogen is embedded in the field oxide adjacent the tunnel oxide.

FIG. 1D illustrates masking of the memory array.

FIG. 1E illustrates removal of layers formed during memory array fabrication as well as the peripheral tunnel oxide adjacent the field oxide.

FIG. 1F illustrates formation of a gate oxide in the periphery adjacent the field oxide.

FIG. 2A illustrates a field oxide being formed on a silicon substrate to define two active regions, referred to as a memory array region and a peripheral region.

FIG. 2B illustrates a protective layer being formed over array and peripheral regions.

FIG. 2C illustrates an etching process where the protective layer is removed from the array region.

FIG. 2D illustrates a tunnel oxide being formed in the array region and a nitridation process being performed on the tunnel oxide where the protective layer prevents nitrogen from being deposited into the underlying layers.

FIG. 2E illustrates masking being performed on the memory array.

FIG. 2F illustrates removal from the periphery of the layers formed during memory cell fabrication, the protective layer and the tunnel oxide layer.

FIG. 2G illustrates growth of a gate oxide in the periphery.

FIGS. 2H–I illustrate process steps for selectively forming the protective layer in the periphery.

FIG. 2H illustrates masking the periphery.

FIG. 2I illustrates etching the protective layer from the memory array.

FIGS. 3A–G illustrate a process for fabricating an integrated circuit where nitrogen deposited in oxide layers during fabrication is removed using HF.

FIG. 3A illustrates a field oxide being formed on a silicon substrate to define two active regions, referred to as a memory array region and a peripheral region.

FIG. 3B illustrates a tunnel oxide being grown over the silicon substrate.

FIG. 3C illustrates a nitridation process being performed on the tunnel oxide.

FIG. 3D illustrates masking being performed on the memory array region.

FIG. 3E illustrates the removal from the periphery of the layers formed during memory cell fabrication and the tunnel oxide.

FIG. 3F illustrates the gate oxide being grown in the periphery.

FIG. 3G illustrates removal of the gate oxide using a fluoride ion source.

FIG. 3H illustrates growth of a second gate oxide layer.

FIG. 4A illustrates a field oxide being formed on a silicon substrate to define two active regions, referred to as a memory array region and a peripheral region.

FIG. 4B illustrates a tunnel oxide being grown over the silicon substrate.

FIG. 4C illustrates a nitridation process being performed on the tunnel oxide.

FIG. 4D illustrates masking being performed on the memory array region.

FIG. 4E illustrates the removal from the periphery of the layers formed during memory cell fabrication and the tunnel oxide.

FIG. 4F illustrates the gate oxide being grown in the periphery by an HTO process.

DETAILED DESCRIPTION

The invention relates to a process for fabricating an integrated circuit including an array of memory cells in which an oxynitride layer is selectively formed in regions within the memory array without forming oxynitride layers in regions peripheral to the memory array. The invention also relates to a process for fabricating an integrated circuit including an array of memory cells where oxynitride layers formed in regions peripheral to the memory array can be selectively removed. Both processes of the present invention are designed to overcome the difficulty of gate oxide thinning in peripheral regions that arises from the formation of oxynitride in the peripheral regions during fabrication of the memory array. The invention also relates to a process for fabricating an integrated circuit in which a gate oxide is formed by high temperature oxidation, a process for oxide growth which is not limited by the presence of nitrogen in neighboring oxide layers.

FIGS. 1A–F illustrate steps for forming a gate oxide according to the prior art in which no steps are taken to prevent nitrogen from being deposited in the periphery or to remove the nitrogen that is deposited in the periphery. As this process illustrates, thinning is observed in a gate oxide grown adjacent to a field oxide in which nitrogen has been deposited during prior processing steps.

Figure 1A:
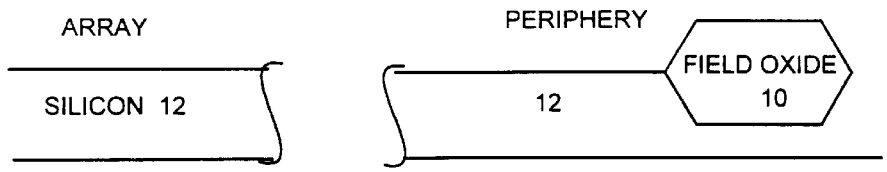
FIGS. 1A–F illustrate steps for fabricating an integrated circuit according to the prior art in which gate oxide thinning results from the presence of nitrogen in an adjacent field oxide.

FIG. 1A illustrates a field oxide 10 formed on a silicon substrate 12 to define two active regions, namely a memory array region and a peripheral region.

Figure 1B:

FIG. 1B illustrates a tunnel oxide 14 grown over the silicon substrate 12.

Figure 1C:
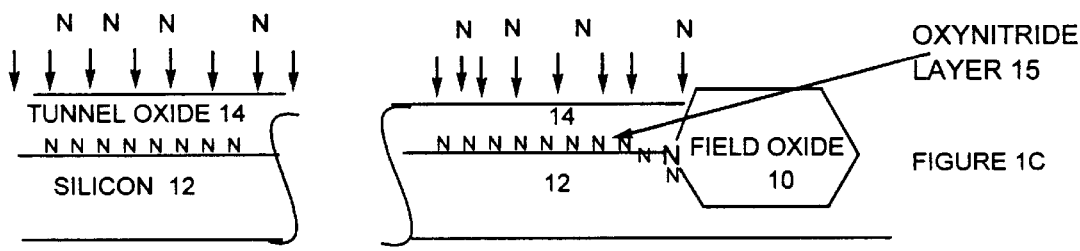

FIG. 1C illustrates a nitridation process being performed on the tunnel oxide 14. During the nitridation process, nitrogen (N) is deposited into the field oxide 10 in an area adjacent the tunnel oxide 14. It should be understood that the nitridation process is illustrative of one of a variety of methods for forming an oxynitride layer, all of which are intended to fall within the scope of the present invention.

Figure 1D:
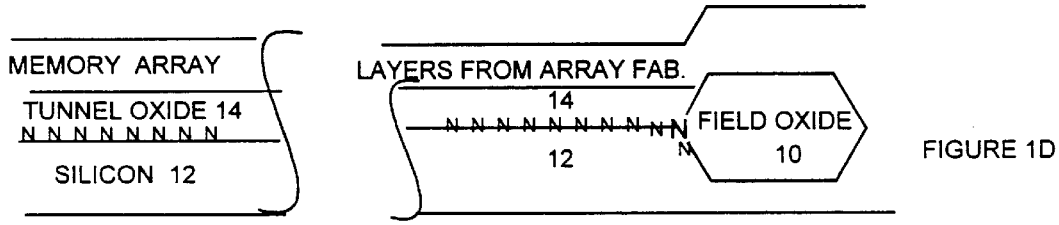

FIG. 1D illustrates the step of masking the memory array, for example, to form a memory cell 16. As illustrated in FIG. 1D, layers are also formed peripheral to the memory array during memory cell fabrication.

Figure 1E:
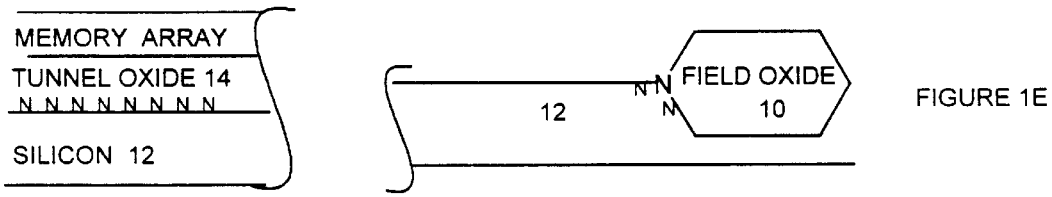

FIG. 1E illustrates removal of layers formed during memory cell fabrication as well as the peripheral tunnel oxide 14 adjacent the field oxide 10. As illustrated in FIG. 1E, nitrogen (N) remains deposited in the field oxide 10 after removal of the peripheral tunnel oxide 14.

Figure 1F:
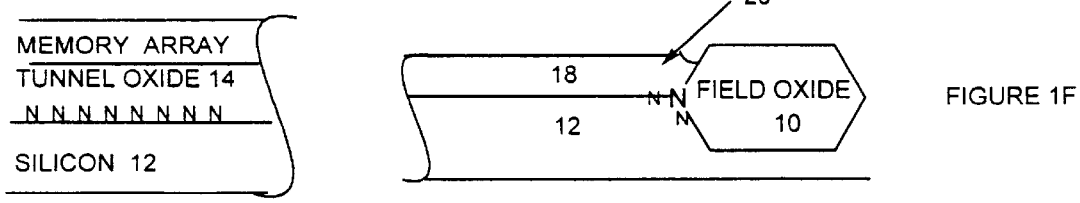

FIG. 1F illustrates the formation of a gate oxide 18 in the periphery adjacent the field oxide 10. As illustrated in FIG.

1F, the presence of nitrogen in the field oxide 10 limits the growth of the gate oxide 18 adjacent the field oxide 10, causing thinning 20 of the gate oxide 18 adjacent the field oxide 10. This thinning 20 is avoided by the processes of the present invention.

According to one process of the present invention, illustrated in FIGS. 2A–G, an oxynitride layer is selectively formed in regions within the memory array without forming oxynitride layers in regions peripheral to the memory array. By selectively forming the oxynitride within the memory array, little or no oxynitride is formed in the periphery to cause oxide thinning as was illustrated in FIG. 1G.

Figure 2A:
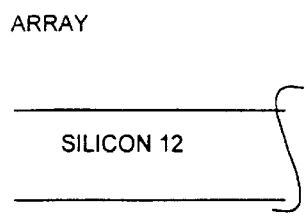
FIGS. 2A–G illustrate a process for fabricating an integrated circuit where an oxynitride layer is selectively formed in regions within a memory array without forming oxynitride layers in regions peripheral to the memory array.
Figure 2A:
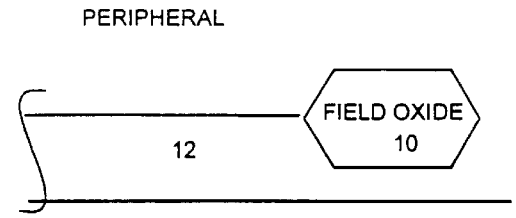

FIG. 2A illustrates a field oxide 10 being formed on a silicon substrate 12 to define two active regions, namely a memory array region and a peripheral region.

Figure 2B:
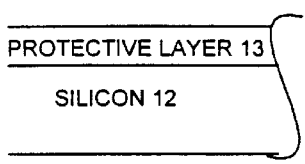
Figure 2B:
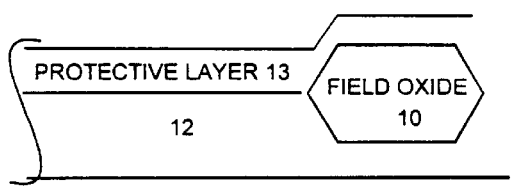

As illustrated in FIG. 2B, a protective layer 13 is formed over the array and peripheral regions. The protective layer 13 serves to prevent an oxynitride layer from being formed in the regions underlying the protective layer 13. Hence, the areas covered by the protective layer 13 determine the areas being protected.

Figure 2C:
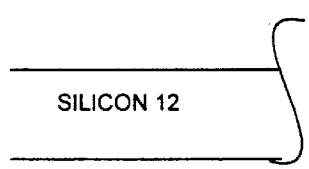
Figure 2C:
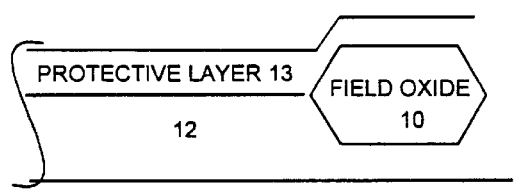

As illustrated in FIG. 2C, the protective layer 13 is removed from the array region by etching. FIGS. 2H–I illustrate an exemplary process for performing the step of removing the protective layer 13 from the array region illustrated in FIG. 2C.

In a preferred embodiment, a sacrificial oxide is grown over the silicon layer 12 prior to forming the protective layer 13. Then after the etching step illustrated in FIG. 2C to remove the protective layer 13, the sacrificial oxide is removed by a HF dip, these two additional steps serving to clean the silicon layer prior to tunnel oxide layer 14 formation.

Figure 2D:
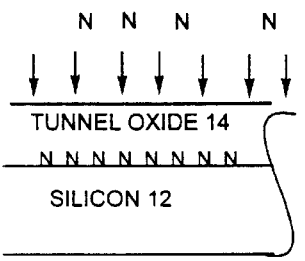
Figure 2D:
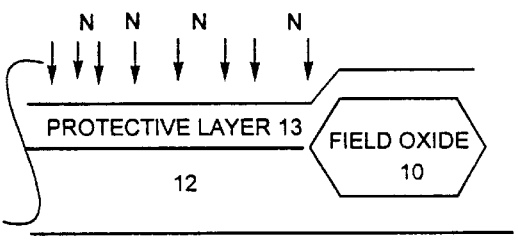

As illustrated in FIG. 2D, a tunnel oxide 14 is formed over the array region and a nitrogenation process is conducted on the tunnel oxide 14, for example using $N_2O$ or NO, to form an oxynitride layer 15 at the silicon 12—tunnel oxide 14 interface. Unlike the prior art, illustrated above in FIG. 1C, the protective layer 13 covering the field oxide 10 and the portion of the tunnel oxide 14 prevents an oxynitride layer from being formed in the areas covered by the protective layer 13. It should be understood that the nitrogenation process is illustrative of one a variety of methods for forming an oxynitride layer, all of which are intended to fall within the scope of the present invention.

With regard to forming the tunnel oxide 14 and oxynitride 15 layers, it should be understood that these layers may be formed by any one of a variety of methods known in the art. For example, the tunnel oxide layer 14 may be formed followed by an anneal in a nitrogen ambient to form the oxynitride layer 15. Alternatively, the tunnel oxide 14 may be formed in the presence of a nitrogen source such that the oxynitride layer 15 forms at the same time as the tunnel oxide 14.

Figure 2E:
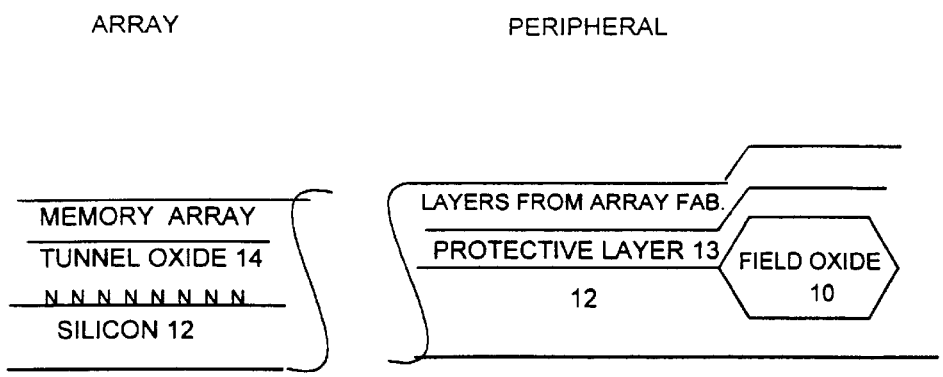

As illustrated in FIG. 2E, masking is performed on the memory array region, for example to form a memory cell. At the same time, additional layers are also formed in the periphery.

Figure 2F:
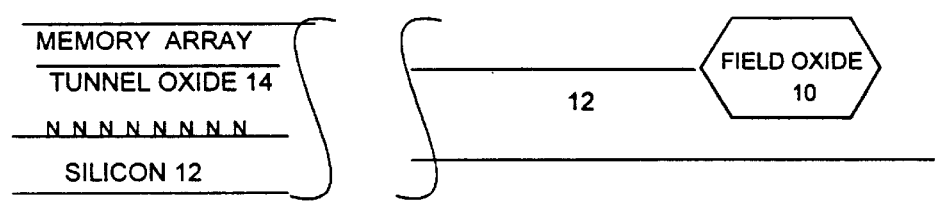

As illustrated in FIG. 2F, the layers formed during memory cell fabrication, the protective layer 13 and the tunnel oxide 14 are removed from the periphery.

Figure 2G:
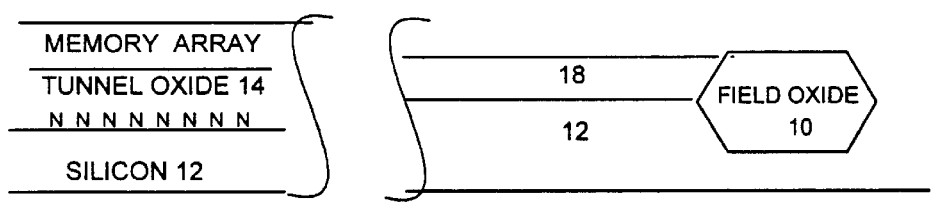

As illustrated in FIGS. 2G, a gate oxide 18 is then grown in the periphery. Due to the presence of the protective layer 13, nitrogen is not deposited into the field oxide 10 during the nitrogenation process. As a result, thinning of the gate oxide 18 adjacent the field oxide 10 is not observed.

Formation of the protective layer 13 over the field oxide 10 and the peripheral area adjacent the field oxide 10 may be accomplished by a variety of mechanisms. For example, as illustrated in FIGS. 2H–I, the protective layer 13 may be selectively formed over the periphery by forming the protective layer over both the memory array and the periphery regions (FIG. 2B), masking the periphery with a photoresist layer 17 (FIG. 2H), and etching the protective layer 13 from the memory array (FIG. 2I) such that the protective layer 14 is removed from the array region (FIG. 2C).

The photoresist layer 17 is used in the present invention in order to adjust the Vt threshold. Etching may also be performed to selectively remove the protective layer 14 from the array region.

The protective layer may be made of any material which serves as an effective barrier to prevent nitrogen accumulation in the field oxide during the nitrogenation process and is preferably a layer of silicon nitride. Other suitable protective layer materials include, but are not limited to polysilicon, amorphous polysilicon and oxides.

The protective layer should be sufficiently thick to prevent penetration of nitrogen during the nitrogenation process into the underlying oxide. When silicon nitride is used as the protective layer, the silicon nitride layer preferably has a thickness of at least about 100 Å, the minimum thickness depending on the oxynitride layer forming process being employed.

According to an alternate embodiment of the invention, a process is provided for removing oxynitride layers formed in regions peripheral to the memory array. In this embodiment, a fluoride ion source is used to remove the gate oxide. The fluoride ion source may be a HF based solution, such as a Buffer Oxide Etchant, for providing a wet etch or may be a plasma containing fluoride ions for providing a dry etch. The plasma may be formed using a variety of gases which act as a source of fluoride ions, including, for example, $C_2F_6$, $CF_4$, and $CHF_3$. The fluoride ion source also serves to reduce the amount of nitrogen accumulated in the field oxide, thereby enabling a second gate oxide to be grown adjacent the field oxide without thinning. A mask may be used as a protective layer to prevent etching by the fluoride ion source.

Figure 3A:
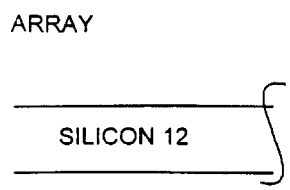
Figure 3A:
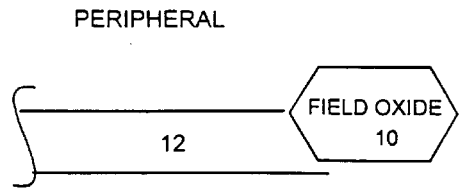
Figure 3B:
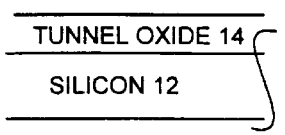
Figure 3B:
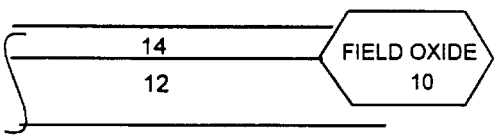

FIGS. 3A–H illustrate an embodiment of the process of the present invention in which a fluoride source is used to remove nitrogen accumulated at the silicon-oxide interface. As illustrated in FIG. 3A, a field oxide 10 is formed on a silicon substrate 12 to define two active regions, namely a memory array region and a peripheral region. FIG. 3B illustrates a tunnel oxide 14 being grown over the silicon substrate 12.

Figure 3C:
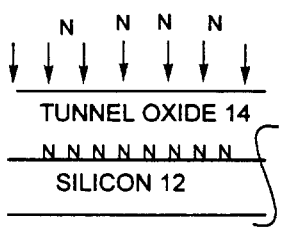
Figure 3C:
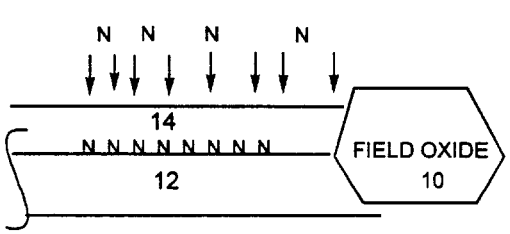

FIG. 3C illustrates a nitrogenation process being performed on the tunnel oxide 14. As illustrated in FIG. 3C, the nitrogenation process results in the accumulation of nitrogen in the field oxide 10.

Figure 3D:
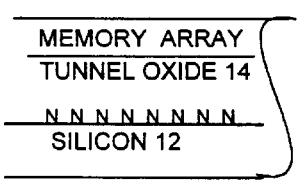
Figure 3D:
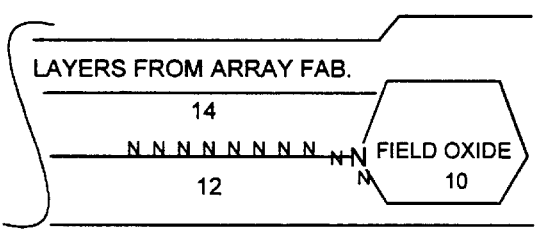
Figure 3E:
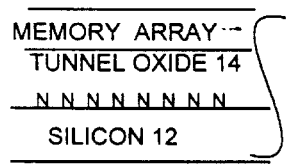
Figure 3E:
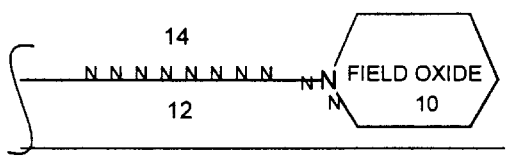

As illustrated in FIG. 3D, masking is performed in the memory array region, for example to form a memory cell. At the same time, layers are also formed in the periphery. FIG. 3E illustrates the layers formed during memory cell fabrication and the tunnel oxide 14 being removed from the periphery.

FIG. 3F illustrates the gate oxide 18 being grown in the periphery. Due to the presence of nitrogen in the field oxide 10, thinning of the gate oxide 18 adjacent the field oxide 10 edge is observed. As illustrated in FIG. 3G, the gate oxide 18 is then removed by exposing the gate oxide to a compound serving as a fluoride ion source. The fluoride ion source may be a HF based solution, such as a Buffer Oxide Etchant, for providing a wet etch or may be a plasma containing fluoride ions for providing a dry etch. The plasma may be formed using a variety of gases which act as a source of fluoride ions, including, for example, $C_2F_6$, $CF_4$, and $CHF_3$. The fluoride ion source serves not only to remove the gate oxide but also to remove nitrogen embedded in the field oxide 10 during the nitrogenation process.

After removal of the gate oxide, a second gate oxide 22 is grown. As illustrated in FIG. 3H, no thinning of the second gate oxide 22 is observed due to the prior removal of nitrogen from the field oxide 10.

In a third, alternate embodiment of the present invention, thinning of the gate oxide 18 due to the presence of nitrogen in the field oxide 10 is avoided by the formation of a gate oxide 18 by a high temperature oxidation process (HTO). HTO processes refer to processes for depositing a silicon oxide layer through the oxidation of a silicon source, such as $SiH_4$ or $SiH_2Cl_2$, with an oxygen source, such as $N_2O$ or NO at an elevated temperature, generally above 700° C. An example of suitable conditions for forming an HTO oxide is the reaction of $SiH_2Cl_2$ (90 sccm) with $N_2O$ (180 sccm) at 800° C. and a pressure of 0.4 torr.

Silicon oxide films formed by HTO processes are not limited by the presence of an oxynitride layer. As a result, thinning is not observed when the gate oxide 18 is formed by a high temperature oxidation process (HTO).

The HTO oxide layer may be formed in both the memory array and peripheral regions at a point in the fabrication of a memory cell in the memory array such that the HTO oxide serves as an interpoly dielectric.

The HTO oxide layer may also be formed in both the memory array and peripheral regions where the peripheral region is then later masked so that the HTO region can be selectively removed from the memory array region.

Figure 4A:
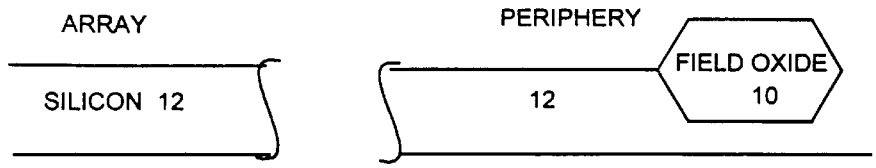
FIGS. 4A–F illustrate a process for fabricating an integrated circuit where a gate oxide layer is formed in the presence of nitrogen embedded in a field oxide layer by a high temperature oxidation process.
Figure 4B:
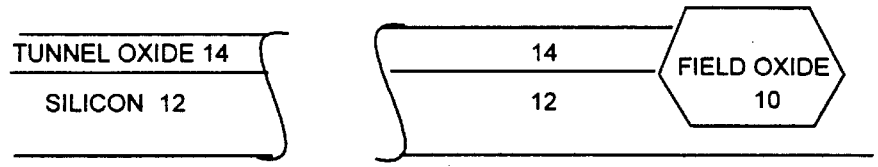

FIGS. 4A–F illustrate an embodiment of the process of the present invention in which an HTO oxide layer is employed. As illustrated in FIG. 4A, a field oxide 10 is formed on a silicon substrate 12 to define two active regions, namely a memory array region and a peripheral region. FIG. 4B illustrates a tunnel oxide 14 being grown over the silicon substrate 12.

Figure 4C:
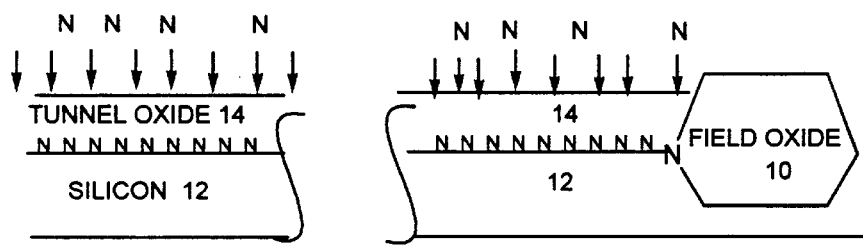

FIG. 4C illustrates a nitrogenation process being performed on the tunnel oxide 14. As illustrated in FIG. 4C, the nitrogenation process results in the deposition of nitrogen into the field oxide 10.

Figure 4D:
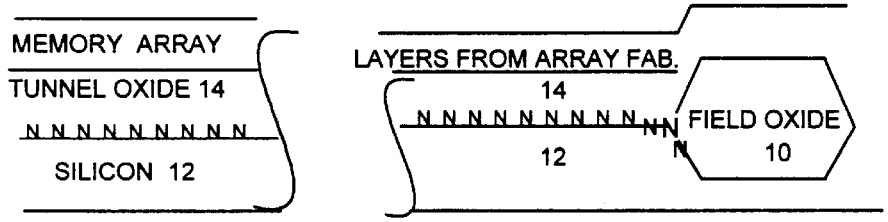
Figure 4E:
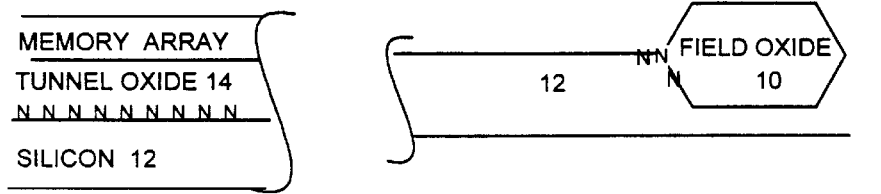

As illustrated in FIG. 4D, masking is performed on the array, for example to form a memory cell. At the same time, layers are also formed in the periphery. FIG. 4E illustrates the layers formed during memory cell fabrication and the tunnel oxide 14 being removed from the periphery.

Figure 4F:
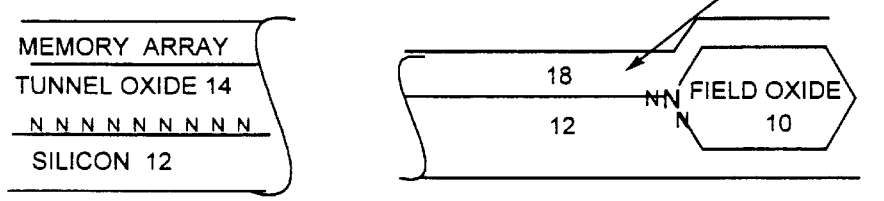

FIG. 4F illustrates the gate oxide 18 being grown in the periphery by an HTO process, for example, by the reaction of $SiH_2Cl_2$ (90 sccm) with $N_2O$ (180 sccm) at 800° C. and a pressure of 0.4 torr. As illustrated in FIG. 4F, a gate oxide layer 18 is formed without a gate oxide thinning despite the presence of nitrogen embedded in the field oxide 10.

The foregoing description of preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A process for fabricating an integrated circuit comprising:

forming a first oxide layer to define at least a first and a second active region on a substrate;

forming a protective layer over the first active region;

nitrogenating the first oxide layer, the protective layer preventing formation of an oxynitride layer in the first active region;

forming a memory cell in the second active region; and removing the protective layer from the first active region; and forming a second oxide layer in the first active region.

2. The process according to claim 1 wherein the protective layer is formed in the first active region by the steps of forming the protective layer in the first and second active regions, masking the first active region to form a masked first active region, the second active region remaining unmasked, and etching the protective layer from the unmasked second active region.

3. The process according to claim 1 wherein the protective layer is formed in the first active region by selectively forming the protective layer in the first active region without forming the protective layer in the second active region.

4. The process according to claim 1 wherein the step of forming the protective layer includes forming a silicon nitride layer in the first active region.

5. The process according to claim 1 wherein the protective layer is a silicon nitride layer having a thickness of at least about 100 Å.

6. The process according to claim 1 wherein the step of forming the memory cell includes forming a memory cell selected from the group consisting of EPROM, EEPROM and flash EPROM memory cells.

7. A process for fabricating an integrated circuit comprising:

forming a first oxide layer to define at least a first and a second active region on a substrate;

nitrogenating the first oxide layer;

removing the nitrogenated first oxide layer from the first active region;

forming a second oxide layer on the first active region;

removing the second oxide layer by treatment of the second oxide layer with a source of fluoride ions; and forming a third oxide layer.

8. The process according to claim 7 wherein the step of removing the nitrogenated first oxide layer from the first active region is performed by treatment of the nitrogenated first oxide layer with HF.

9. The process according to claim 7 further including the step of forming a memory cell in the second active region.

10. The process according to claim 9 wherein the step of forming a memory cell is performed prior to removal of the nitrogenated first oxide layer from the first active region.

11. The process according to claim 9 wherein the step of forming a memory cell includes forming a memory cell selected from the group consisting of EPROM, EEPROM and flash EPROM memory cells.

* * * * *